United States Patent [19]

Kishi et al.

[11] Patent Number: 5,431,579
[45] Date of Patent: Jul. 11, 1995

[54] SOCKET FOR IC PACKAGE

[75] Inventors: Nobuaki Kishi; Nobuhisa Arai; Masanori Takagishi; Hiroshi Henmi, all of Saitama, Japan

[73] Assignee: Chichibu Fuji Co., Ltd., Saitama, Japan

[21] Appl. No.: 272,840

[22] Filed: Jul. 11, 1994

[30] Foreign Application Priority Data

Jul. 13, 1993 [JP] Japan .................................. 5-173290

[51] Int. Cl.⁶ ............................................ H01R 11/22
[52] U.S. Cl. ..................................... 439/266; 439/331
[58] Field of Search ............... 439/259, 261, 264, 266, 439/268, 269, 330, 331

[56] References Cited

U.S. PATENT DOCUMENTS

| | | | |
|---|---|---|---|
| 4,498,047 | 2/1985 | Hexamer et al. | 439/260 X |
| 4,533,192 | 8/1985 | Kelley | 439/259 X |
| 4,715,823 | 12/1987 | Ezura et al. | 439/267 X |
| 5,244,404 | 9/1993 | Kishi et al. | 439/331 |
| 5,326,271 | 7/1994 | Kishi et al. | 439/72 |

FOREIGN PATENT DOCUMENTS

| | | |
|---|---|---|
| 63-307678 | 12/1988 | Japan . |
| 4154065 | 5/1992 | Japan . |
| 5104178 | 4/1993 | Japan . |
| 5157310 | 6/1993 | Japan . |

OTHER PUBLICATIONS

English Language Abstract of JP 4-154065.
English Language Abstract of JP 63-307678.

*Primary Examiner*—Khiem Nguyen
*Attorney, Agent, or Firm*—Sandler, Greenblum & Bernstein

[57] ABSTRACT

A receiving tray 6 is disposed on a pedestal surface 1a of a base member 1 vertically and movably, while below the pedestal surface 1a are disposed a push-up member 7 interlocked with the receiving tray and a spring 8 for urging the push-up member 7 downwards. A seating surface if for package leads P2 is formed along side portions of the pedestal surface 1a, and a large number of contacts 2 are arranged side by side, the contacts 2 having respective contact portions 2a for contact with the leads P2 which contact portions 2a are urged inwards to obtain a predetermined contact pressure for the leads. There are used movable cams 4 adapted to rotate upon depression of a cover 5 which covers the base member, to displace the contact portions 2a of the contacts 2 outwards away from the package leads P2. The movable cams 4 are each provided with an actuating arm 4c which comes into abutment with the push-up member 7 upon depression of the cover 5 and consequent rotation of the cam 4 to push up the receiving tray 6.

2 Claims, 10 Drawing Sheets

／5,431,579

SOCKET FOR IC PACKAGE

FIELD OF THE INVENTION

The present invention relates to a socket for use in testing whether a manufactured IC package (hereinafter referred to sometimes merely as "package") is good or bad.

BACKGROUND OF THE INVENTION

According to the construction of a conventional, known socket for IC package, a large number of contacts are arranged side by side along side portions of an IC package receiving space formed on the upper surface of a base member, the contacts each having a contact portion for contact with a lead of the IC package received in the receiving space and also having a spring portion for biasing the contact portion inwards to obtain contact pressure for the lead, and the contact portion of each contact is displaced outward against the biasing force of the spring portion by depressing a cover which covers the base member, thereby permitting the IC package to be mounted and removed in an unloaded condition (see Japanese Patent Laid Open Nos. 154065/92 and 307678/88).

The applicant in the present case has previously invented and filed an application for a socket for IC package wherein the shape of the spring portion of each contact mentioned above is specified and a projection is formed on the upper surface of the spring portion, while a recess for engagement with the projection is formed in a connection shaft which is supported vertically and pivotably along the row of the contacts. Further, movable cams are supported pivotably on both right and left sides of the contact row and a bearing hole in the shape of an elongated hole or a circular hole for pivotally supporting support portions at both ends of the connection shaft is formed in each of the movable cams. This eliminates drawbacks of the above conventional socket and bring about excellent advantages in all of the contact pressure of the contact portions for the leads of IC package, operating load in depressing the cover, operation life thereof and a sure gripping ability for IC package (see Japanese Patent Application Nos. 104178/93 and 157310/93).

In the foregoing conventional socket and the above socket filed previously by the applicant in the present case, as shown in FIG. 12, a central portion of the upper surface of a base member 100 is used as a receiving space 101 for a package body P1, the receiving space 101 is surrounded with a rib 102, a seating surface 103 for package leads P2 is formed outside the rib 102, and contact portions 301 of contacts 300 are displaced outward by depression of a cover 200 to bring the seating surface 103 into a vacant state for reception of an IC package.

The depressing operation of the cover 200 and the mounting work for the IC package are automated. For the mounting of the package there is adopted a method wherein the package P is carried up to the position just above the receiving space 101 by means of a vacuum chuck for example, and in this state the vacuum is released, thereby allowing the package to drop. After the IC package has thus dropped, the package body P1 is moved into the receiving space 101 while being guided by the positioning rib 102 and a guide slant 201, and when the leads P2 are seated on the seating surface 103, the package body is set on the base member 100.

However, a still more detailed study of the above IC package receiving structure and IC package mounting method shows that there still remains the following problem.

In the structure described above, it is very likely that there will occur tilting of the package at the time of dropping thereof. In this case, the leads (or lead group) P2 on the lower side in the tilting direction are the first to sit on the seating surface 103, so the weight of the package body P1 or a dropping impact is imposed on the leads P2, thus causing deformation and hence providing a defective product.

SUMMARY OF THE INVENTION

The present invention has been accomplished in view of such conventional circumstances and it is the object of the invention to provide a socket for IC package which permits the IC package carried up to the position just above the base member to be received in the package receiving space while keeping it horizontal without causing inclination, in other words, permits all the leads of the package to be seated on the seating surface almost simultaneously, and which thereby eliminates the fear of deformation of the package leads at the time of mounting of the package while coping with automation of the IC package mounting using a vacuum chuck or the like.

According to the present invention, in order to achieve the above-mentioned object there is provided a socket for IC Package wherein an IC package receiving space and a package lead seating surface are formed on the upper surface of a base member, a large number of contacts are arranged side by side along side portions of the package receiving space, the contacts each having a contact portion for contact with each lead of an IC package received in the receiving space which contact portion is adapted to be urged inwards to obtain a contact pressure for the lead, a connection shaft supported vertically pivotably along each row of the contacts is brought into engagement with each contact, the connection shaft having support portions at both ends thereof supported pivotally by movable cams which are supported pivotably on both right and left sides of each contact row, the movable cams and the connection shaft being moved pivotally by depression of a cover mounted to the base member to displace the contact portions of the contacts outwards away from the leads of the IC package, the IC package socket being characterized in that an IC package receiving tray is disposed vertically movably within the package receiving space, that a push-up member interlocked with the package receiving tray and a biasing member for urging the push-up member downward are disposed below the package receiving space, and the movable cams are each provided with an actuating arm which comes into abutment with the push-up member upon depression of the cover and consequent rotation of the movable cam to push up the package receiving tray.

The present invention is further characterized in that the push-up member has a projecting shape at its portion of abutment with the actuating lever of each movable cam.

According to the above construction, as the movable cams and the connection shaft are turned outward by depression of the cover, the contact portions of the contacts are displaced outward against the biasing force of the spring portions, whereby the mounting and removal of IC package can be done in an unloaded condition (see FIG. 6).

At the same time, the actuating arms of the movable cams turn upward with rotation of the cams and force up the push-up member against the biasing force of the spring, so that the package receiving tray moves upward. If the IC package positioned just above the receiving tray is dropped in this state, it will be supported on the same tray substantially horizontally (see FIG. 7). In this state, when the depression of the cover is released, the movable cams rotate inward and the actuating arms turn downward away from the receiving tray, so that the receiving tray goes downward under the biasing force of the spring. Integrally with this downward movement of the tray the IC package moves down while maintaining its horizontal state, whereby the distal ends of the leads are seated on the seating surface almost simultaneously (see FIG. 8).

Thus, it is possible to eliminate the conventional drawback of tilting of the package during descent and consequent deformation of the lower-side leads in the tilting direction which are the first to seat the seating surface, and so it becomes possible to effect the mounting of IC package free of the likelihood of leads deformation.

Since the socket for IC package according to the present invention is constructed as above, upon depression of the cover, the contact portions of the contacts are displaced outward simultaneously and the receiving tray disposed within the receiving space moves upward to bear the IC package horizontally, while upon release of the depression of the cover, the package moves down together with the receiving tray, then its leads seat the seating surface substantially simultaneously and the contact portions of the contacts are simultaneously displaced inward into contact with the leads.

Thus, there is provided a highly reliable IC package socket wherein the mounting and removal of the IC package can be done in an unloaded condition by moving the contact portions of the contacts away from the seating surface simultaneously through depression of the cover and which can eliminate the conventional drawback of leads deformation occurring at the time of automatic mounting of IC package using a vacuum chuck or the like.

Further, since the push-up member has a projecting shape at its portion of abutment with the actuating arm of each movable cam, the length of the actuating arm of the cam can be set at an appropriate value; besides, the simplification of shape can be attained by omitting the actuating arm.

DETAILED DESCRIPTION OF THE INVENTION

Figure 1:
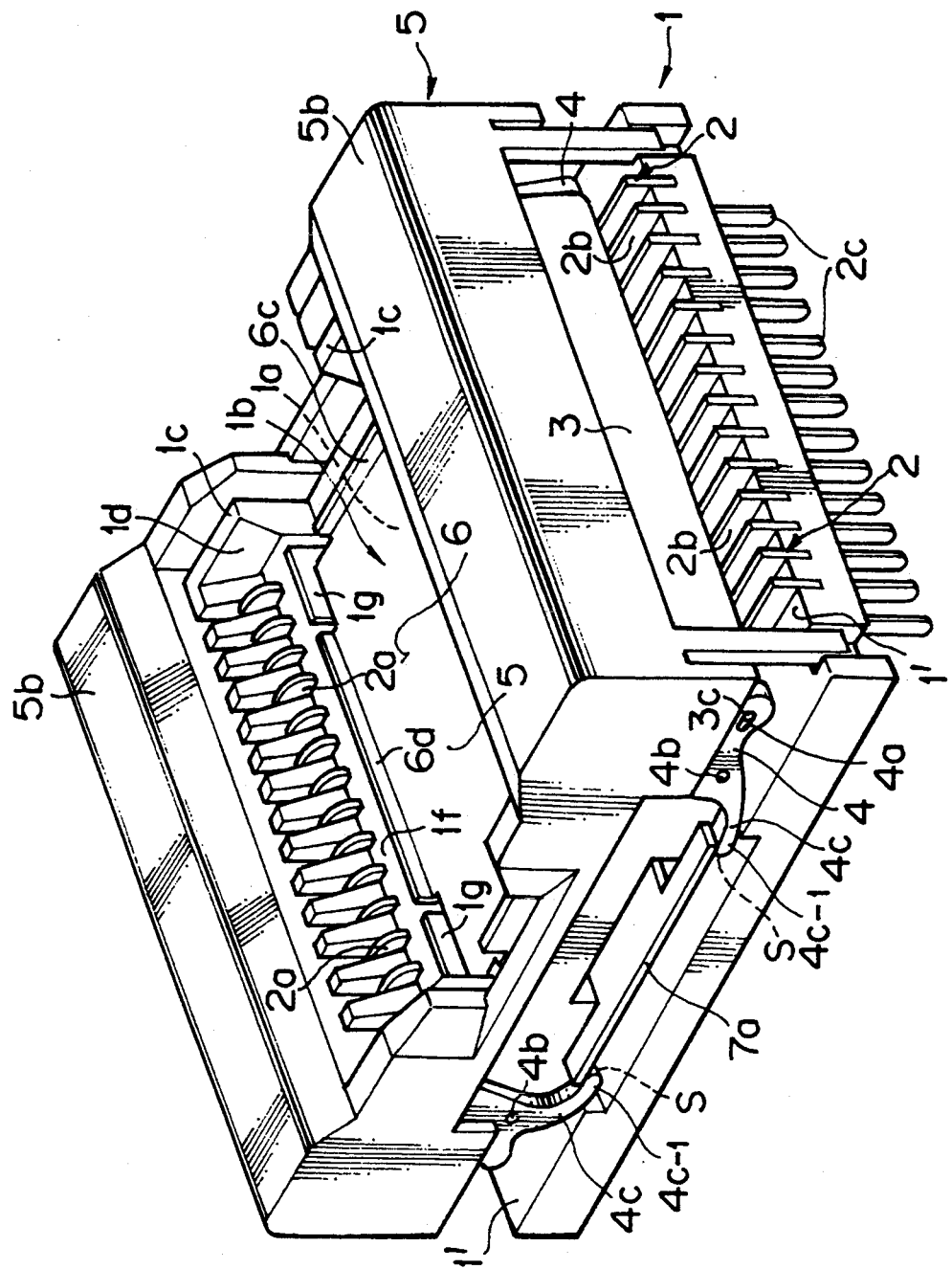
FIG. 1 is a perspective view showing an appearance of a socket for IC package according to an embodiment of the present invention.
Figure 2:
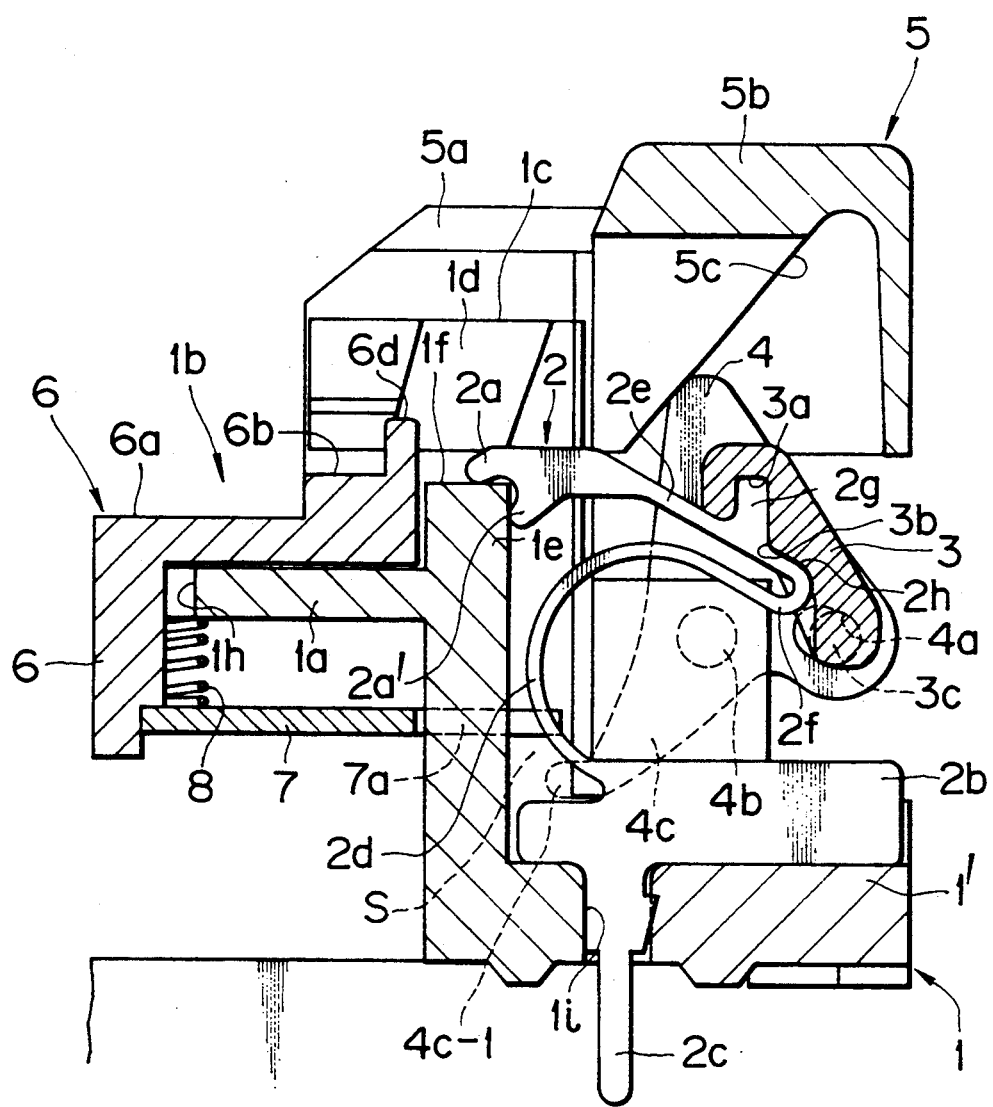
FIG. 2 is a vertically sectional front view thereof, showing only one half portion, with the other half portion omitted.
Figure 3:
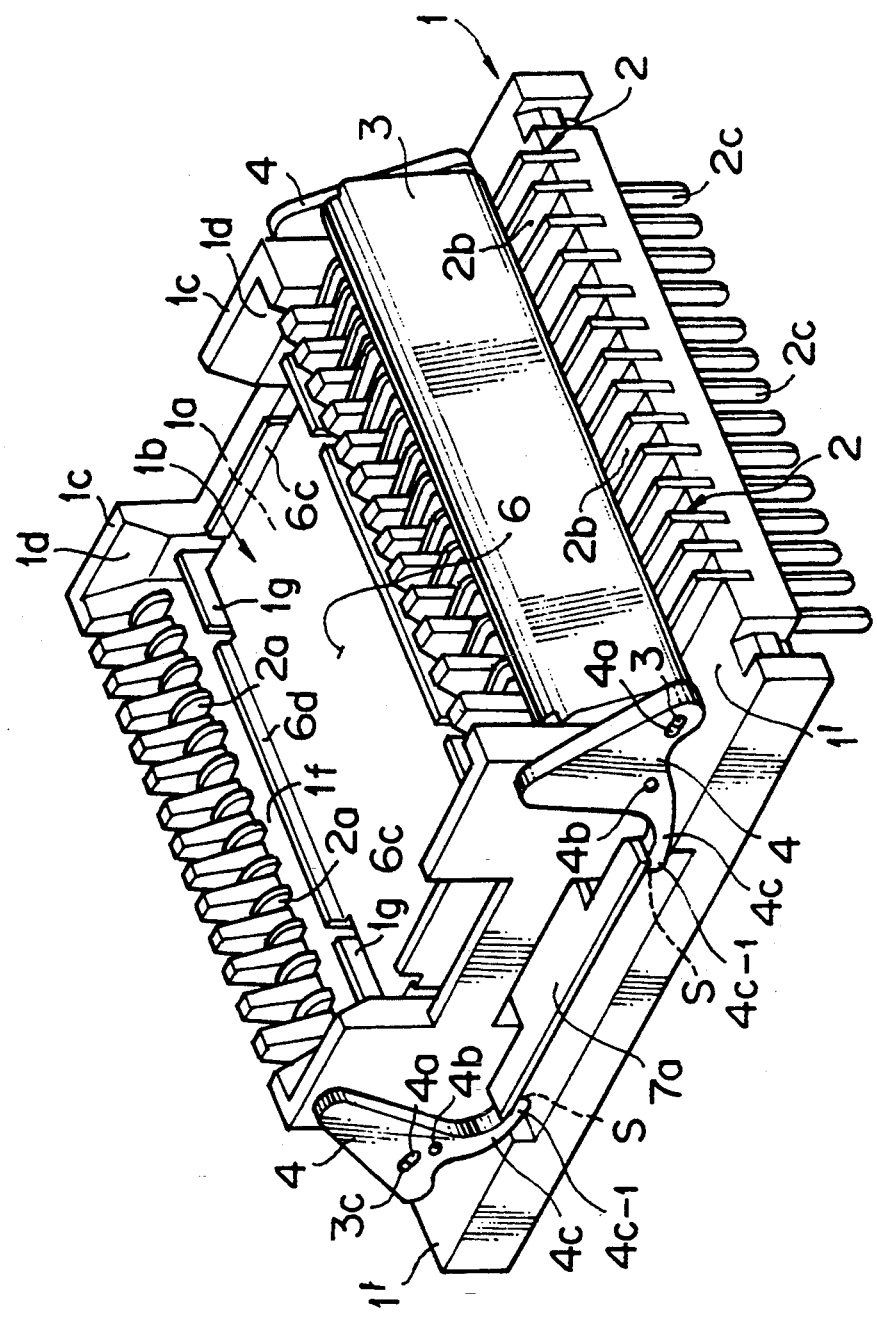
FIG. 3 is a perspective view showing an appearance of the socket with the IC package cover in FIG. 1 omitted.
Figure 4:
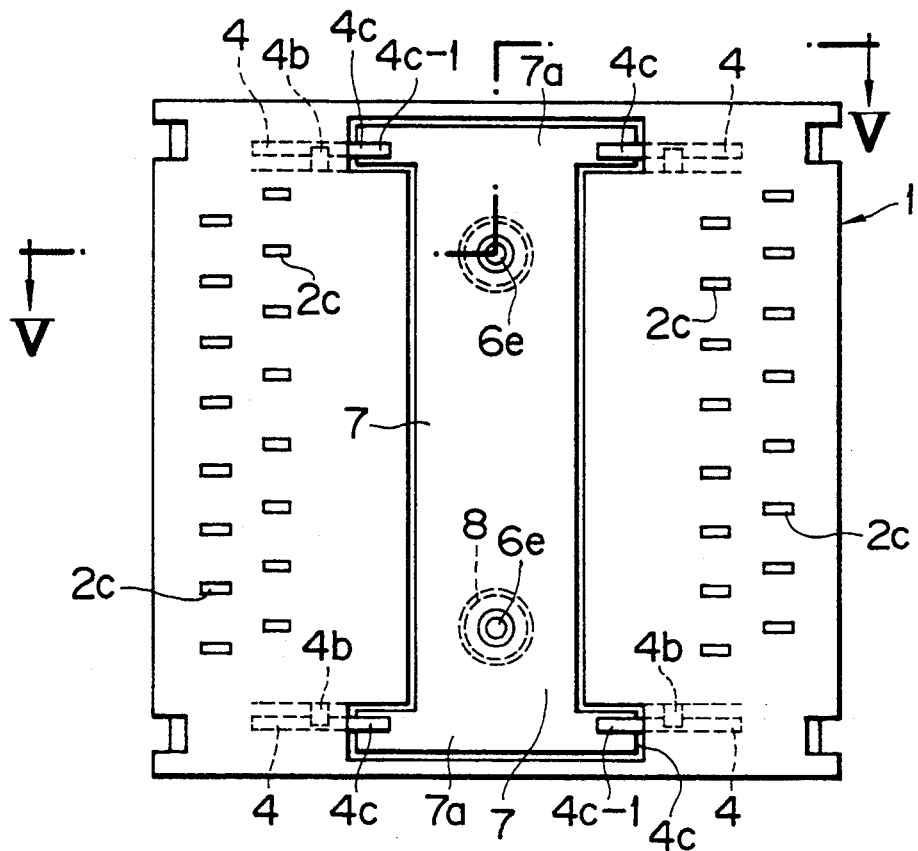
FIG. 4 is a bottom view of the IC package shown in FIG. 3.
Figure 5:
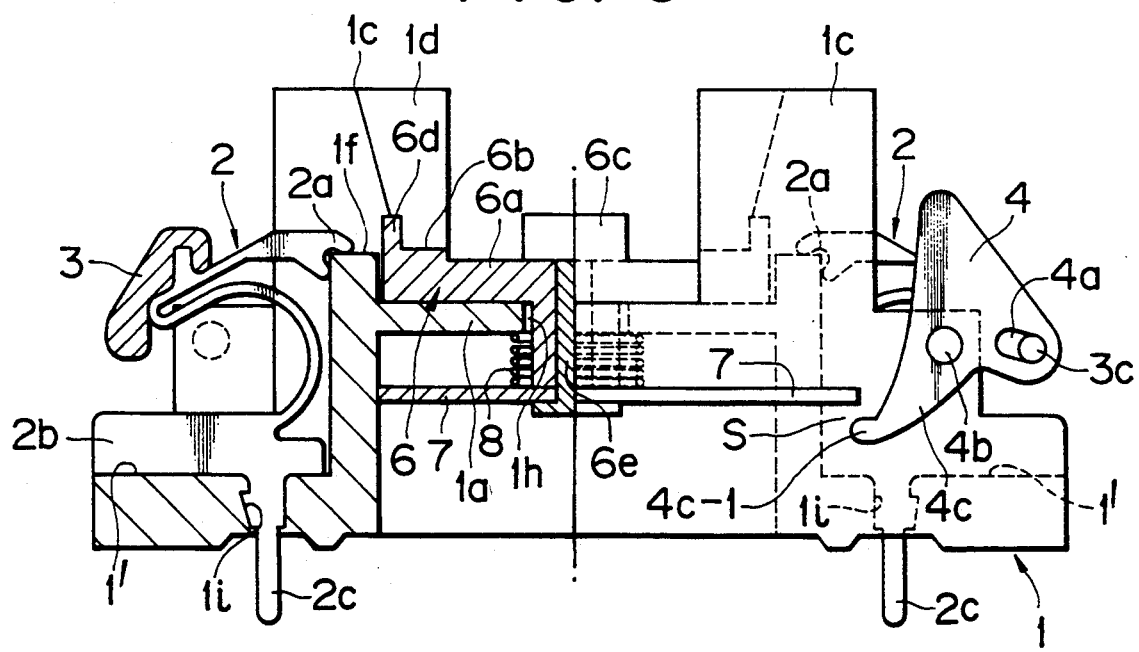
FIG. 5 is an enlarged sectional view taken along line (V)-(V) in FIG. 4.

Sockets for IC package embodying the present invention will be described below with reference to the accompanying drawings.

Embodiment I

In FIGS. 1 to 8, which illustrate an embodiment of the invention, bearing holes 4a for supporting support portions 3c at both ends of a connection shaft 3 to be described later are each formed in the shape of an elongated hole. In those figures, the reference numeral 1 denotes a base member, numeral 2 denotes a contact, numeral 3 a connection shaft, numeral 4 a movable cam, numeral 5 a cover, numeral 6 a receiving tray, and the reference mark P represents an IC package.

The base member 1 is formed by molding using an insulating material so as to provide a centrally raised pedestal surface 1a which is rectangular in plan, with an IC package P receiving space 1b being formed above the pedestal surface 1a. Guide walls 1c are erected along any two opposed sides out of the four sides which surround the pedestal surface 1a, and their inner surfaces are inclined to provide guide faces 1d for guiding the IC package into the receiving space 1b. Along the other two sides out of the four sides mentioned above are erected side walls 1e, and outside the side walls 1e are arranged a large number of contacts 2 side by side. Further, the upper surface of each side wall 1e with which a contact portion 2a of each contact 2 come into contact and engagement serve as a seating surface if for leads P2 of the IC package P received in the receiving space 1b. On inner edges of both end portions of each side 1e are erected ribs 1g adjacent to both sides of a rib 6d which will be described later.

In two positions substantially on a central line of the pedestal surface 1a are formed holes 1h into which are inserted support shafts 6e loosely and slidably as will be described later. Within the receiving space 1b, the receiving tray 6 is mounted on the pedestal surface 1a, while below the receiving space 1b, that is, below the pedestal surface 1a, there is disposed a push-up member 7 which is interlocked with the receiving tray 6 and a spring 8 as a biasing member which urges the push-up member 7 downward.

The receiving tray 6 is in the form of a rectangular plate capable of being loaded vertically and movably into the space above the pedestal surface 1a surrounded by the guide walls 1c, 1c and side walls 1e, 1e, namely the receiving space 1b. A concave portion 6a is formed centrally of the upper surface of the receiving tray 6, and the marginal portion which surrounds the concave portion 6a is used as a bearing surface 6b for an IC package body P1. Further, ribs 6c and 6d are formed along the outer edge of the bearing surface 6b to prevent falling of the package body P1 put on the bearing surface.

On the underside of the receiving tray 6 are provided support shafts 6e integrally and projectingly in two positions opposed to the holes 1h, the support shafts 6e being inserted into the holes 1h loosely and slidably, and the push-up member 7 is fixed between the lower ends of both support shafts 6e, 6e.

The push-up member 7 is in the form of a rectangular plate capable of being loaded vertically and movably into the space formed below the pedestal surface 1a and it is engaged with the receiving tray 6 through the support shafts 6e so as to be interlocked with the receiving tray. At both end portions of the push-up member 7 are integrally provided engaging places 7a which extend sideways of the base member 1 through the guide walls 1c. A spring 8 for urging the push-up member 7 downward is fitted on each support shaft 6e, whereby the receiving tray 6 is normally urged toward the pedestal surface 1a.

The contacts 2 are each formed by monolithic molding using a desired electrically conductive material so as to have its shape shown in FIG. 1, that is, so as to have a contact portion 2a for contact with leads P2 of the IC package P and also have a spring portion to be described later which spring portion urges the contact portion 2a inwards to obtain a contact pressure for the lead P2. A lower flat plate portion 2b of each contact 2 is put on the upper surface of an outer peripheral portion 1' of the base member 1, and a terminal 2c extending downward from the flat plate portion 2b is inserted through a mounting hole 1i, whereby the contact is fixed in a vertically raised state on the outer peripheral portion 1'.

As illustrated in the drawings, the front end of each contact 2 is generally C-shaped, and the upper end side thereof is used as the contact portion 2a, while the lower end side is allowed to function as a positioning stopper 2a' which comes into sliding contact with the outer surface of the associated side wall 1e of the base member 1. The terminal 2c formed at the lower end of the contact 2 is inserted into a terminal insertion hole of a test circuit (not shown).

The spring portion of each contact comprises a curved, first spring part 2d extending upwardly inward from an inner edge of the flat plate portion 2b and then turned back outward, and a second spring part 2e turned back inward from the front end of the first spring part 2d and contiguous to the contact portion 2a and stopper 2a'. The contact portion 2a is urged downward by the biasing force of both spring parts 2d and 2e so that a higher gripping ability for the IC package P can be obtained while maintaining the contact pressure of the contact portions 2a for the leads P2, the operating load in depressing the cover 5 and the operation life thereof at predetermined values, respectively. On the upper surface of the second spring part 2e is formed a projection 2g in a position close to a connection 2f with the first spring part 2d.

The connection shaft 3 is disposed along the row of many contacts 2 described above. On the upper-end side of the lower surface of the connection shaft 3 is formed an engaging recess 3a for engagement with the projection 2g, and in an intermediate position of the said lower surface contiguous to the engaging recess 3a is formed an engaging surface portion 3b for engagement with a portion 2h behind the projection. Further, on both right and left sides of the connection shaft 3 are provided supporting shafts 3c projecting in lower positions, which support shafts 3c are inserted into bearing holes 4a of the movable cams 4 to support the cams vertically and pivotably.

The body portion of each movable cam 4 is in such a generally triangular shape in front view as illustrated in the drawings and it has a pivot shaft 4b for the base member 1 on an inner end side of its lower portion, while on an outer end side of its lower portion is formed the bearing hole 4a. The pivot shafts 4b of the movable cams whereby 4 are supported by the base member 1, whereby the cams are supported pivotably so as to rise on both right and left sides of each row of the contacts 2. The bearing holes 4a, namely fulcrums of the connection shaft 3, are each formed in the shape of an elongated hole in proximity to the connection 2f between the first spring part 2d and the second spring part 2e of each contact 2.

At the corner portion on the pivot shaft 4b side of each movable cam 4 there integrally extends an actuating arm 4c which comes into abutment with the engaging plate 7a upon depression of the cover 5 and consequent rotation of the cam 4 and pushes up the push-up member 7. The actuating arm 4c is formed in a predetermined shape so that a gap S is ensured between a front end 4c-1 of the arm and the engaging plate 7a in a standby state (the state shown in FIG. 2) of the movable cam 4.

The gap S is set suitably so that when the cover 5 (to be described later) is depressed, the contact portions of the contacts are displaced outward and thereafter the receiving tray 6 begins to rise. When the depression of the cover 5 is released, the return of the contact portions 2a to the seating surface if is done after the leads P2 of the IC package P have sat on the seating surface if completely.

The cover 5 is provided with: a central opening 5a for opening the receiving space 1b, enclosure portions 5b along two opposed sides of the opening 5a to cover the rows of the many contacts 2, and inwardly inclined slant faces 5c formed inside the enclosure portions 5b and in end positions on the right and left sides. The slant faces 5c come into sliding contact with the upper ends of the movable cams 4, whereby the cover is supported vertically and movably while covering the base member 1 from above.

The connection shaft 3, movable cams 4, cover 5, receiving tray 6 and the push-up member 7 are each formed by monolithic molding using an insulating material.

The IC package P is of a known structure having a large number of generally Z-bent leads P2 arranged side by side on side edges of the package body P1 which is put on the receiving tray 6.

Figure 8:
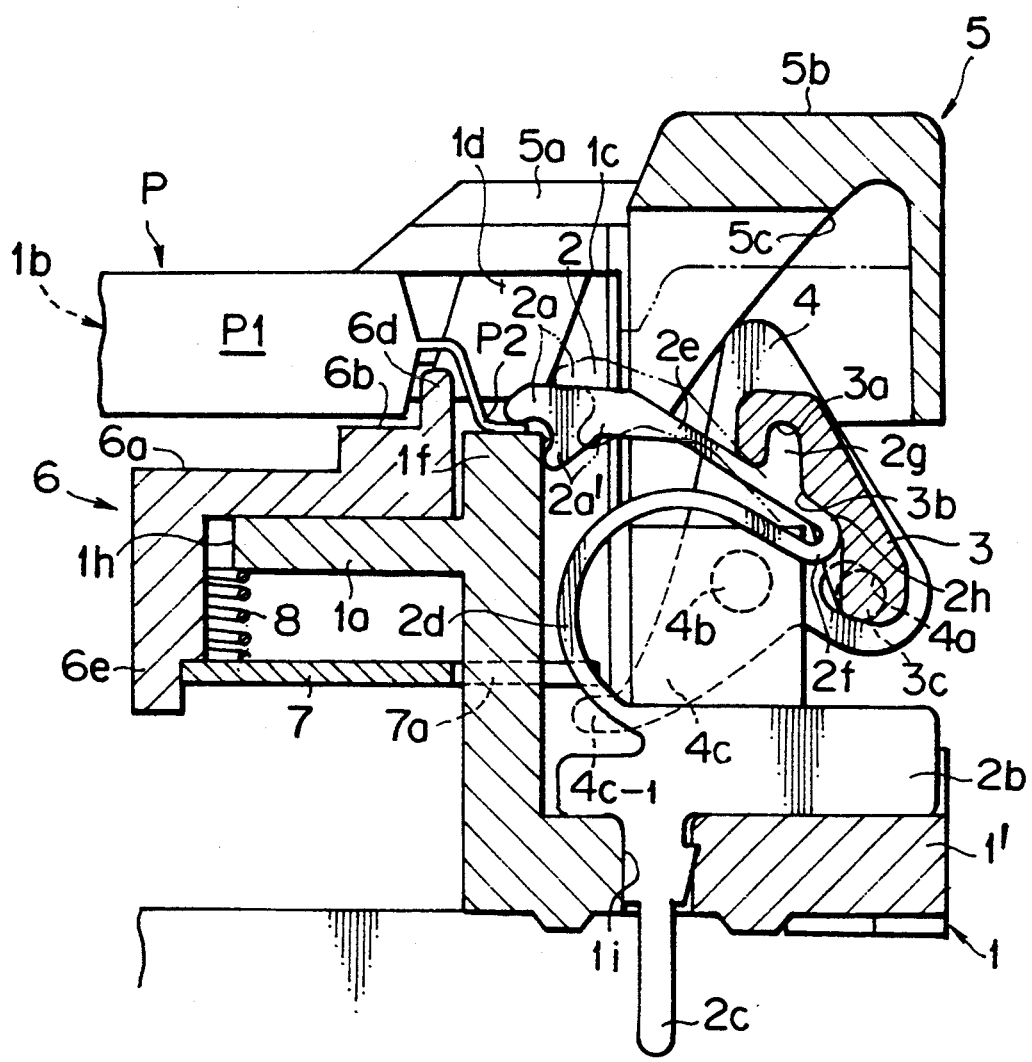
FIG. 8 is a sectional view showing a set state of the IC package in FIG. 2.

According to the socket of this embodiment constructed as above, the biasing force of the first spring part 2d and that of the second spring part 2e in each contact 2 acts in a direction to press the contact portion 2a downward, whereby there is obtained a higher gripping ability for the IC package P while maintaining the contact pressure of the contact portion 2a for the lead P2, the operating load in depressing the cover 5 and the operation life thereof at predetermined values, respectively, (see FIG. 8).

Figure 6:
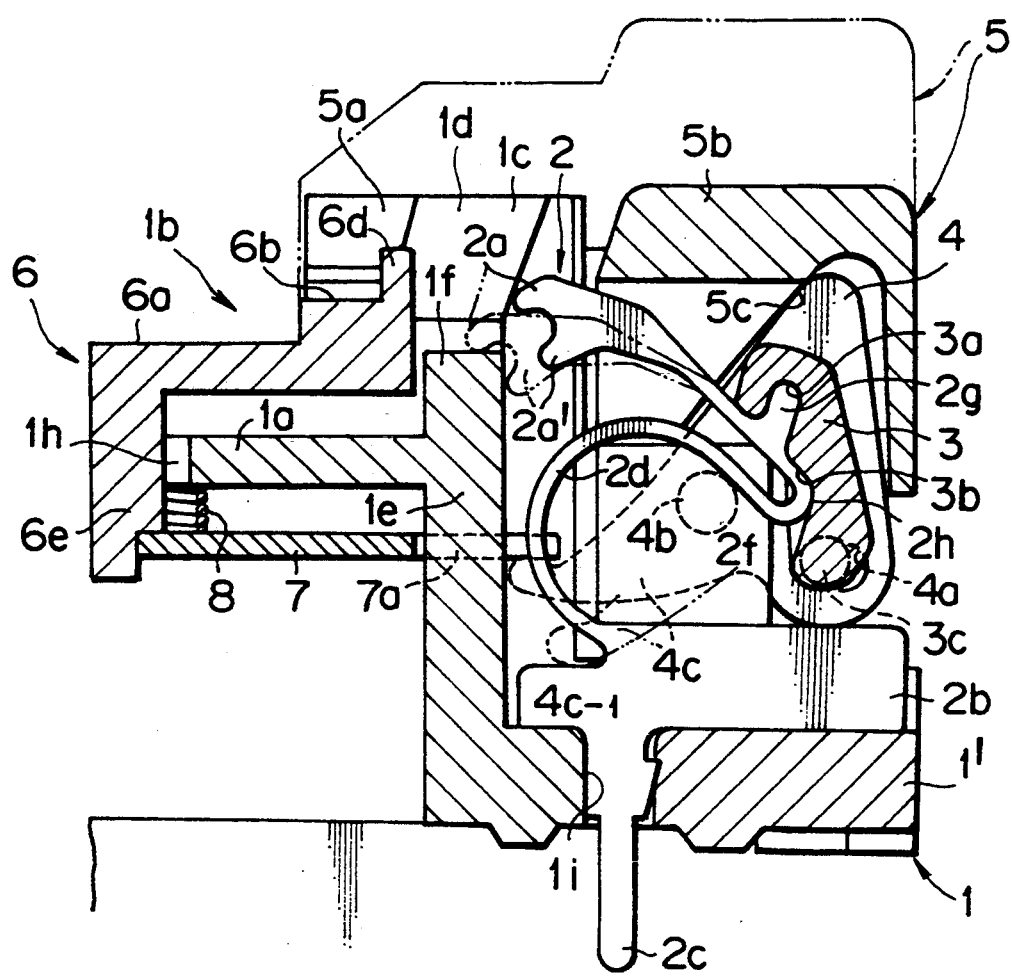
FIG. 6 is a sectional view showing a raised state of an IC package receiving tray in FIG. 2.
Figure 7:
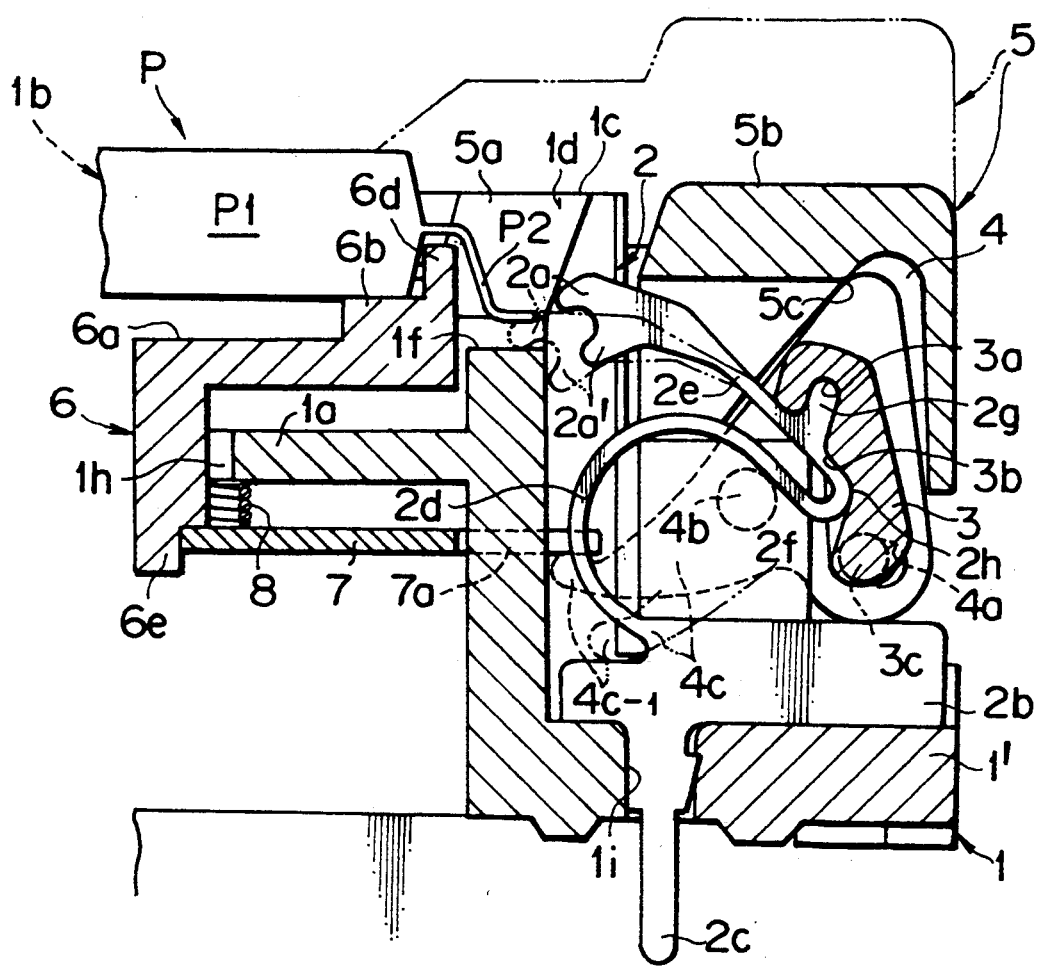
FIG. 7 is a sectional view showing the IC package as put on the receiving tray in FIG. 6.

The mounting and removing operations for the IC package P are performed in the following manner. As shown in FIG. 6, upon depression of the cover 5, the movable cams 4 turn outwards to press the supporting shafts 3c in the bearing holes 4a downwardly inwards. Connection shaft 3 turns downward and the engaging surface portion 3b thereof pushes the behind-projection portion 2h of each contact 2 downwardly and inwards to compress the first spring part 2d. At the same time, the engaging recess 3a pushes the projection 2g downwardly outward, thereby causing the second spring part 2e to turn upwardly outwards, so that the contact portion 2a of the contact 2 is displaced outward against the biasing force of the spring portion, thus resulting in that the seating surface if assumes a vacant state.

In this case, since the spring portion has the foregoing shape and the bearing hole 4a is formed in the shape of an elongated hole, there is no fear of deformation of each lead P2 in comparison with the conventional products wherein the contact portion 2a is generally displaced horizontally. That is, at the beginning of the displacement the contact portion 2a rises substantially vertically and thereafter moves obliquely outwards.

Further, with rotation of each movable cam 4, the actuating arm 4c turns upward and its front end 4c-1 comes into abutment with the engaging plate 7a and pushes up the engaging plate and hence the push-up member 7 against the biasing force of the spring 8, so that the receiving tray 6 moves up.

When in this state the IC package P is carried to the position just above a receiving tray 6 by means of a vacuum chuck or the like. When the vacuum is released, the IC package falls and is rested on the bearing surface 6b of the receiving tray 6 while being guided by the ribs 6c, 6d, 1g and guide faces 1d, whereby it is supported substantially horizontally within the receiving space 1b.

When in this state the depression of the cover 5 is released, each movable cam 4 turns inward and its actuating arm 4c turns downward, so that its front end 4c-1 moves away from the engaging plate 7a and the receiving tray 6 moves downward under the biasing force of the spring 8. The IC package P on the tray 6 also goes down integrally with the downward movement of the tray 6 while its horizontal state is retained, so that the front end portions of the leads P2 sit on the seating surface if almost simultaneously (see FIG. 8).

Thus, it is possible to eliminate the drawback of the prior art product that there occurs tilting of the package during descent and the leads of the package positioned on the lower side in the tilting direction which are the first to sit on the seating surface are deformed, whereby there can be effected IC package loading free from any fear of lead deformation.

Further, the connection shaft 3 turns upward with rotation of the movable cams 4 and the contact portions 2a of the contacts 2 are displaced (returned) inwards onto the seating surface if by the biasing force of the respective spring portions, resulting in that the contact portions 2a come into contact at a predetermined contact pressure with the leads P2 which have already been rested on the seating surface 1f, whereby the IC package P is held in place positively as mentioned above. In this state, the terminals 2c of the contacts 2 are inserted into terminal insertion holes of a test circuit (not shown) and a test is conducted to check whether the IC package is good or bad.

After the test is over, the cover 5 is again depressed, with the result that the contact portions 2a of the contacts 2 are displaced outward to the exterior of the seating surface 1f, and thereafter the receiving tray 6 is pushed up to raise the IC package P. In this state (the state shown in FIG. 7), the IC package P is lifted and conveyed to the next process by means of a vacuum chuck for example. Subsequently, the next package P is carried to the socket and the foregoing operations are repeated.

In this embodiment, the gap S is ensured between the front end 4c-1 of each actuating arm described above and the engaging plate 7a to get a timing in such a manner that the contact portions 2a return after the resting of the leads P2 onto the seating surface 1f has been completed and the receiving tray 6 begins to be pushed up to raise the IC package P after the contact portions 2a have moved to the exterior of the seating surface 1f. Such timing can be obtained also by suitably changing the positions of the fulcrums (4b, 4a) of the connection shaft or the abutting position of the front end 4c-1 of each actuating arm with the engaging plate 7a.

Embodiment II

Figure 9:
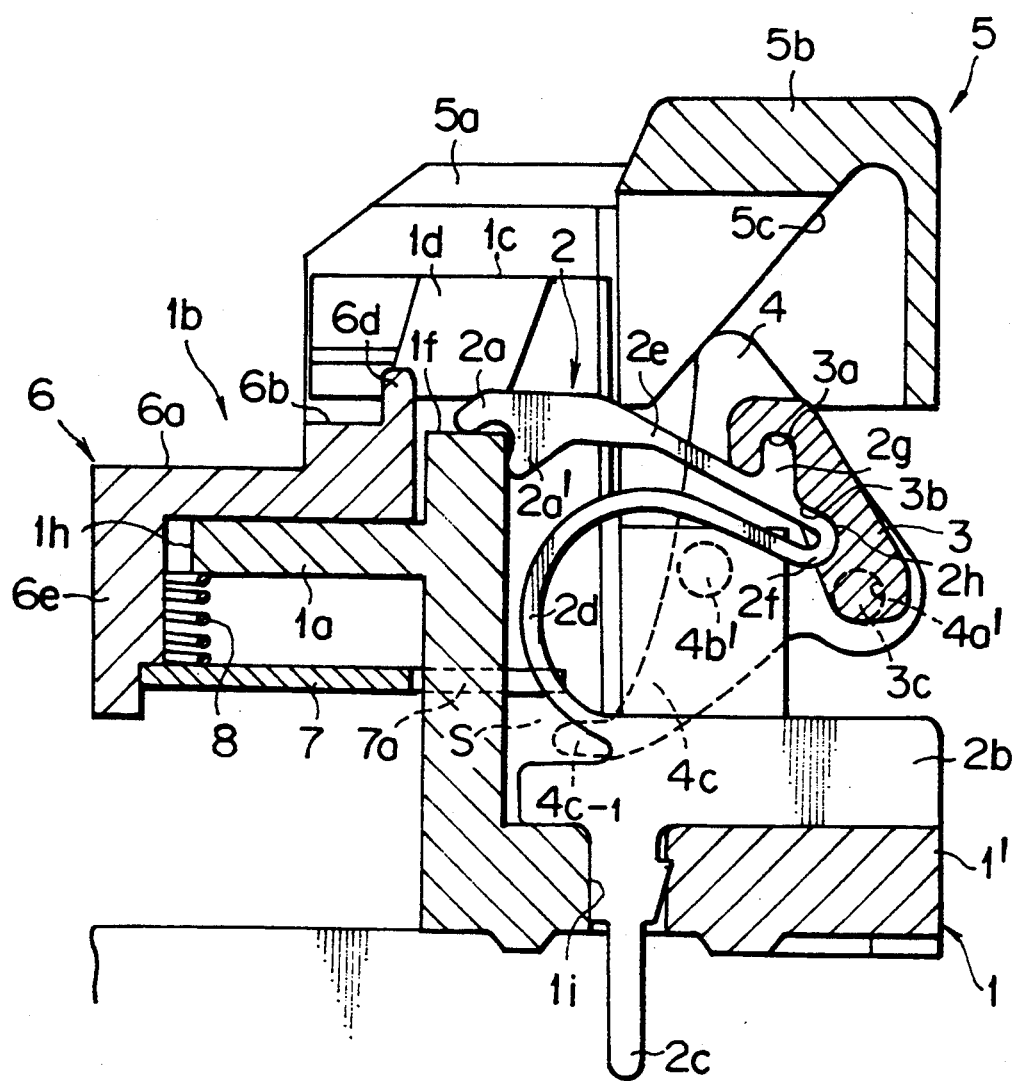
FIG. 9 is a vertically sectional front view of a socket for IC package according to another embodiment of the present invention.

The embodiment illustrated in FIG. 9 is characterized in that circular bearing holes 4a' are used for bearing supporting shafts 3c at both ends of the connection shaft 3 in the above embodiment I and that second pivot shafts 4b' positioned somewhat above the pivot shafts 4b are used as fulcrums of movable cams 4.

The other portions of the connection shaft and movable cams 4 than those just noted above, as well as base member 1, contacts 2, cover 5, receiving tray 6 and push-up member 7, are about the same in construction as those described in the previous embodiment I, so are indicated in the figure by the same reference numerals as in embodiment I and the explanation thereof is here omitted.

In this embodiment the displacement of each contact portion 2a caused by depression of the cover 5 is not such displacement as in embodiment I wherein at the beginning of the displacement the contact portion 2a moves vertically and upward and thereafter moves obliquely outward. However, at an angle extremely close to that displacement direction there is performed the displacement in this embodiment. Consequently, in addition to the foregoing function and effect obtained in embodiment I, there is obtained an advantage that there is no fear of deformation of leads P2 in comparison with prior art products wherein the contact portions 2a are displaced substantially horizontally, while eliminating the likelihood of wobbling of the connection shaft 3 in the case of supporting the support shafts 3c through elongated holes.

Embodiment III

Figure 10:
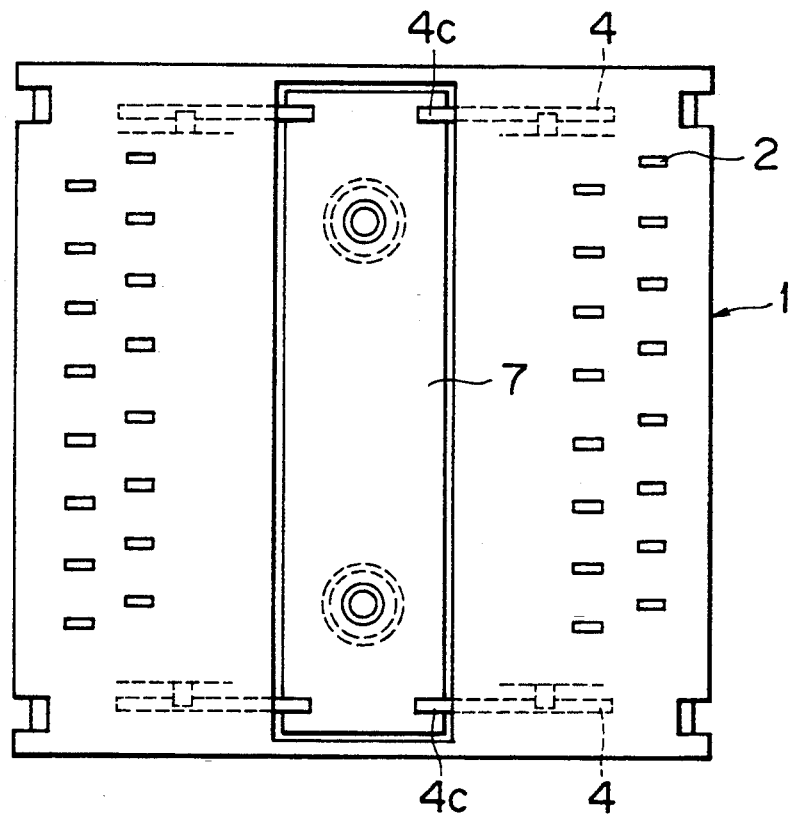
FIG. 10 is a bottom view of a socket for IC package according to a further embodiment of the present invention.

The embodiment illustrated in FIG. 10 is characterized in that the push-up member 7 described in embodiment I has a shape wherein its portion of abutment with the actuating arm 4c of each movable cam 4 is not projecting. In this embodiment, the actuating arm 4c of each movable cam 4 is extended up to the abutting portion of the push-up member 7.

The other portions than those noted just above in connection with the actuating arm 4c and push-up member 7, as well as base member 1, a contacts 2, etc., are almost the same in construction as those described in embodiment I, so are indicated in the figure by the same reference numerals as in embodiment I and the explanation thereof is here omitted.

In this embodiment III, in addition to the foregoing function and effect obtained in embodiment I, there is attained an advantage that the shape of the push-up member 7 is simplified and so the molding thereof is easy.

Embodiment IV

Figure 11:
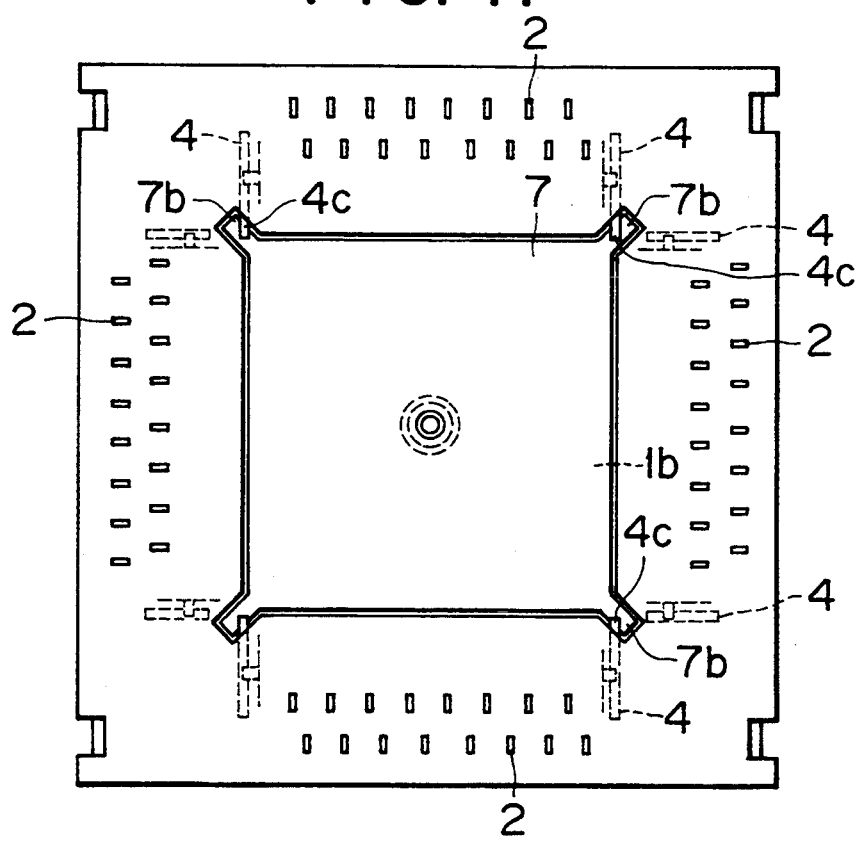
FIG. 11 is a bottom view of a socket for IC package according to a still further embodiment of the present invention.
Figure 12:
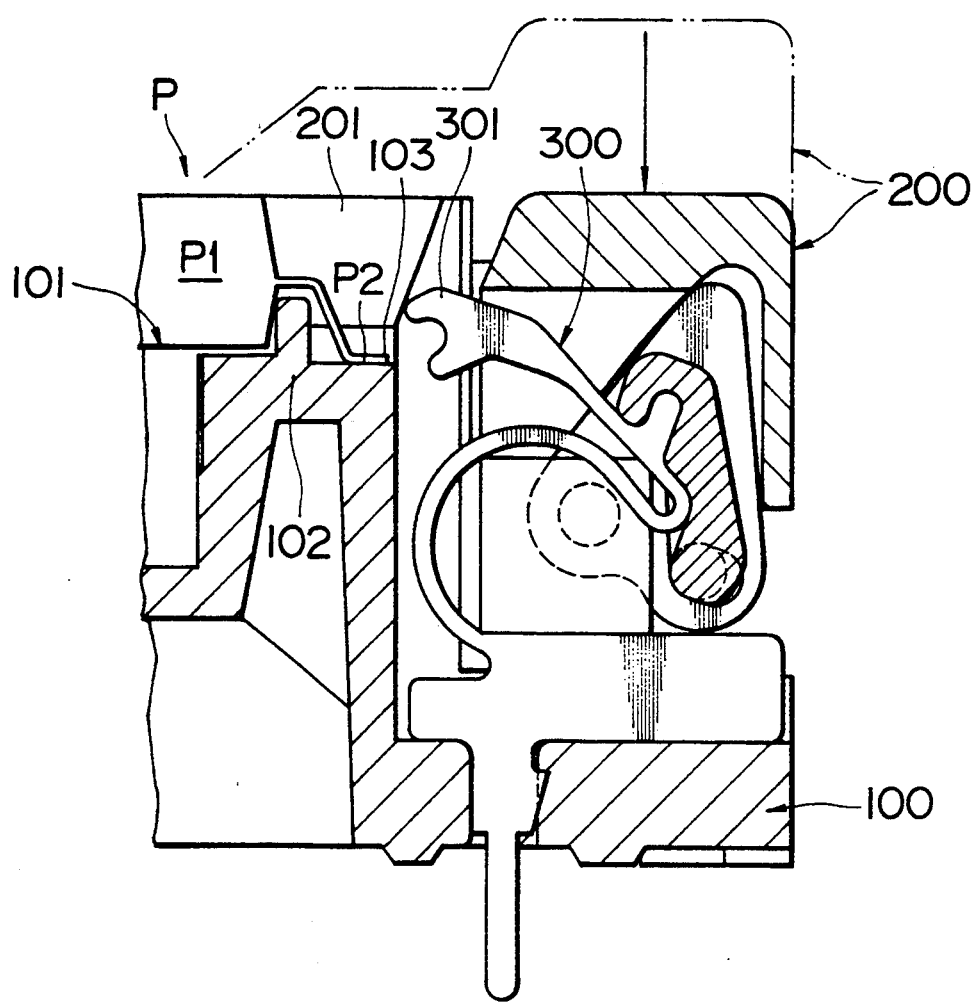
FIG. 12 is a sectional view showing a mounted state of an IC package in a prior art IC package socket.

The embodiment illustrated in FIG. 11 is characterized in that, in the case where the contacts 2 disposed along side portions of the receiving space 1b in embodiment I are disposed along all of the four sides, the abutting portion 7b of the push-up member 7 for abutment with the actuating arm 4c of each movable cam 4 is formed in a projecting shape. The push-up member 7 is pushed up by movable cams 4 arranged opposedly in the longitudinal direction, not requiring actuating arms 4c of movable cams 4 arranged opposedly in the transverse direction.

Other constructional points are basically the same as in embodiment I, so are indicated in the figure by the same reference numerals as in embodiment I and the explanation thereof is here omitted.

In this embodiment IV, in addition to the function and effect obtained in embodiment I, there is attained an advantage that the length of the actuating arm 4c of each movable cam 4 can be set appropriately and that the shape of the cam can be simplified by omitting the actuating arm 4c.

What is claimed is

1. A socket for IC package wherein an IC package receiving space and a seating surface for IC package leads are formed on the upper surface of a base member, comprising a plurality of contacts having respective contact portions for contact with the leads of the IC package when received in said receiving space are arranged side by side along side portions of the receiving space, said contact portions being urged inwards to obtain a contact pressure for the leads, and connection shafts supported vertically and pivotably along the rows of the contacts are brought into contact with said contacts, said connection shafts each having supporting shaft portions at both ends thereof which shaft portions are supported by movable cams, said movable cams being supported pivotably on both right and left sides of each row of the contacts, said movable cams and each of said connection shafts being rotated by a cover depressing operation which cover is mounted over said base member, to displace the contact portions of the contacts outwards away from the leads of the IC package, characterized in that:

an IC package receiving tray is disposed vertically and movably within said receiving space, a push-up member interlocked with said receiving tray and a biasing member for urging said push-up member downwards are disposed below said receiving space, and said movable cams are each provided with an actuating arm which comes into abutment with said push-up member upon depression of said cover and consequent rotation of the movable cam to push up said receiving tray.

2. A socket for IC package according to claim 1, wherein the portion of said push-up member for abutment with said actuating arm of each movable cam has a projecting shape.

* * * * *